(12) United States Patent
Kuesel et al.

(10) Patent No.: US 7,979,828 B2
(45) Date of Patent: Jul. 12, 2011

(54) INTEGRATED CIRCUIT AND METHOD FOR DETERMINING AN INTEGRATED CIRCUIT LAYOUT

(75) Inventors: Andreas Kuesel, Munich (DE); Julie Aunis, Munich (DE); Winfried Kamp, Munich (DE)

(73) Assignee: Infineon Technologies AG (DE)

( * ) Notice: Subject to any disclaimer, the term of this patent is extended or adjusted under 35 U.S.C. 154(b) by 684 days.

(21) Appl. No.: 11/969,888

(22) Filed: Jan. 5, 2008

(65) Prior Publication Data

US 2008/0185688 A1 Aug. 7, 2008

(30) Foreign Application Priority Data

Jan. 5, 2007 (DE) .................. 10 2007 001 196

(51) Int. Cl.
*G06F 17/50* (2006.01)
(52) U.S. Cl. ........................................ 716/119; 716/120
(58) Field of Classification Search .......... 716/118–120, 716/122, 126, 133
See application file for complete search history.

(56) References Cited

U.S. PATENT DOCUMENTS

| 5,635,424 A * | 6/1997 | Rostoker et al. ............. 438/612 |
|---|---|---|
| 5,768,146 A | 6/1998 | Jassowski |
| 5,822,214 A * | 10/1998 | Rostoker et al. ................ 716/10 |
| 5,986,292 A | 11/1999 | Mizuno et al. |
| 2003/0023935 A1 | 1/2003 | McManus et al. |

FOREIGN PATENT DOCUMENTS

| DE | 10025583 | 12/2001 |
|---|---|---|
| JP | 55165668 | 12/1980 |
| KR | 100141419 | 3/1998 |

OTHER PUBLICATIONS

Sakanushi, et al., "Placement Algorithm for Rectilinear Core Cells by Multilayered Parametric BSG", Electronics and Communications in Japan, Part 3, vol. 87, No. 7, 2004, pp. 66-78.
Chang, et al., "Force Directed Self-Organizing Maps for L-Shaped Cell Placement Using Delta Learning Rule", IEEE, 1994, pp. 3381-3386.

* cited by examiner

*Primary Examiner* — Stacy A Whitmore
(74) *Attorney, Agent, or Firm* — Banner & Witcoff, Ltd.

(57) ABSTRACT

Various methods for determining a layout of an integrated circuit are described. For example, a method is described comprising determining a layout of an integrated circuit comprising a plurality of functional cells, wherein a maximum extent of each of the cells in a first direction is identical and wherein an outer boundary of a first cell of the plurality of cells forms a first polygon with at least five corner points; and storing data representing the layout on a computer-readable medium. Integrated circuits in accordance with the layout are also described.

8 Claims, 6 Drawing Sheets

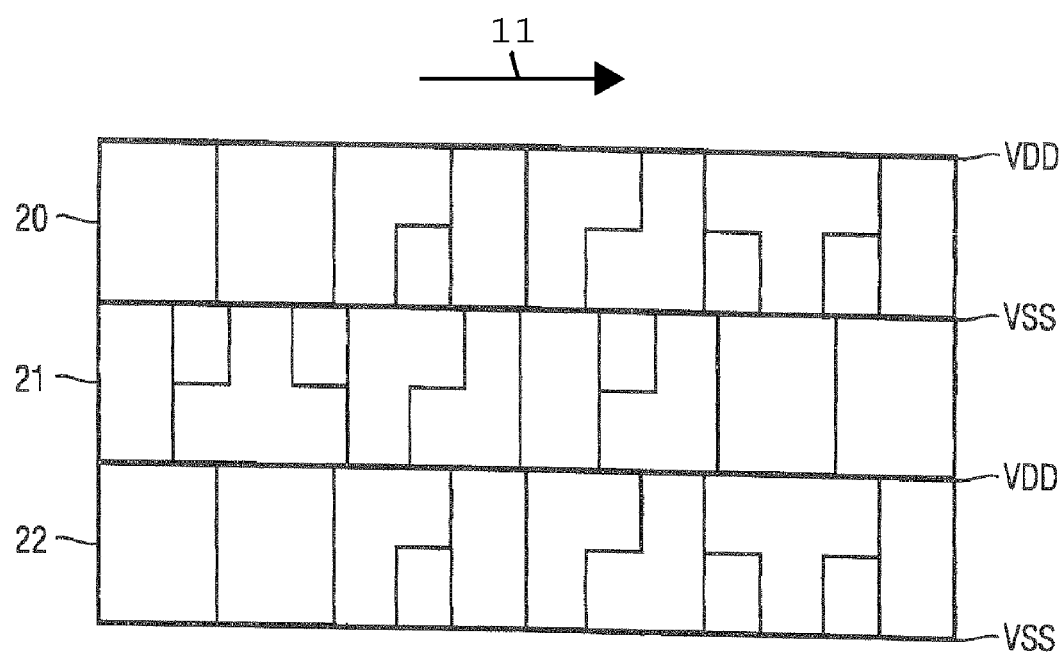

INTEGRATED CIRCUIT AND METHOD FOR DETERMINING AN INTEGRATED CIRCUIT LAYOUT

CROSS-REFERENCE TO RELATED APPICATIONS

This application claims priority to German Patent Application No. 10 2007 001 196.4-33, filed Jan. 5, 2007, and hereby incorporated by reference as to its entirety.

BACKGROUND

Creating the layout of an integrated circuit usually involves running through a sequence of well-defined work steps with the aim of designing a graphical representation of an electronic circuit that corresponds to the later actual arrangement of the circuit on the semiconductor substrate. This may comprise for example the creation of a logical circuit concept, a definition of the components and the interlinking thereof, and also a determination of positioning and wiring of the components. Since multiply recurring elements often regularly occur in integrated circuits, recourse is often had to predefined modular units when designing the layout. The modular units are typically represented graphically by cells when designing the circuit. The cells are also often referred to as standard cells in the technical literature and can be stored in machine-readable cell libraries.

SUMMARY

Various methods for determining a layout of an integrated circuit are described. For example, a method is described comprising determining a layout of an integrated circuit comprising a plurality of functional cells, wherein a maximum extent of each of the cells in a first direction is identical and wherein an outer boundary of a first cell of the plurality of cells forms a first polygon with at least five corner points; and storing data representing the layout on a computer-readable medium. Integrated circuits in accordance with the layout are also described.

These and other aspects will be described in more detail with reference to illustrative embodiments in the following Detailed Description.

BRIEF DESCRIPTION OF THE DRAWINGS

The invention is explained in more detail below in an exemplary manner with reference to the drawings, in which:

FIG. 2 is a schematic of an illustrative plurality of cell rows;

DETAILED DESCRIPTION

Various methods for designing the layout of an integrated circuit are illustrated by way of example below.

Figure 1A:
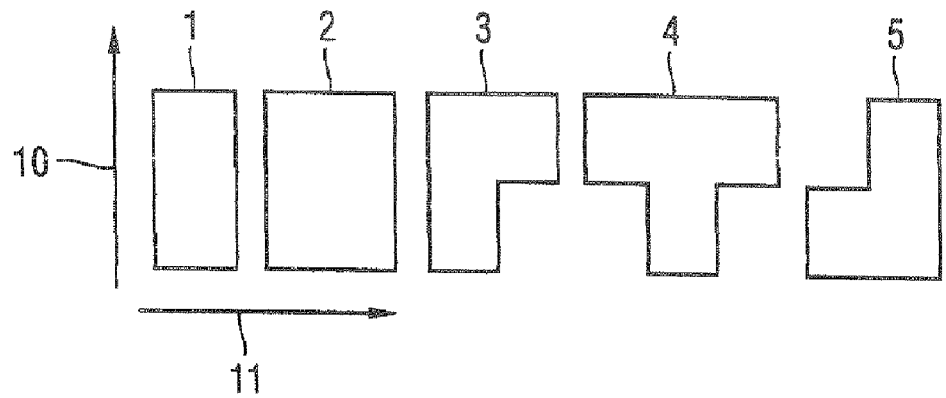
FIG. 1A is a schematic of illustrative cells having differently shaped outer boundary lines.

FIG. 1A schematically illustrates the outer boundary lines of a plurality of cells 1 to 5 as an exemplary embodiment. The cells 1 to 5 represent predefined logic modular units from which an integrated circuit can be constructed. The cells 1 to 5 in this example have an identical maximum extent in a direction 10. The maximum extent of the cells 1 to 5 in a direction 11 perpendicular to the direction 10 may be subject to no restrictions whatsoever, and/or can vary from cell to cell and also within a cell.

The cells 1 and 2 are rectangular cells that differ by virtue of their extents in the direction 11. In this case, the extent of the cells 1 and 2 in direction 11 is constant for each of the two cells 1 and 2. The outer boundary lines of the cells 1 and 2 are polygons with four corner points and in each case right angles between the straight lines connecting the corner points.

The outer boundary lines of the cells 3 to 5 represent polygons with more than four corner points. The cells 3 and 5 each have six corner points, and the cell 4 has eight corner points. Each of the cells 3 to 5 has at least two different extents in direction 11 and therefore also different extents in direction 10. The maximum extent in direction 10 is identical, however, for all the cells 3 to 5. By way of example, the cells can be configured in L-shaped fashion like the cells 3 and 5 or in T-shaped fashion like the cell 4.

The outer boundary lines of the cells 1 to 5 as illustrated in FIG. 1A represent only an exemplary selection of the possible outer cell forms. The cells in particular need not necessarily be symmetrical or have right-angled corners or be restricted to only two different extents in direction 11.

The cells 1 to 5 can be used for example for designing the layout of integrated circuits. In accordance with one exemplary embodiment, the cells 1 to 5 are firstly provided (cf. FIG. 1A) and subsequently positioned for creating the layout. Such a positioning of the cells 1 to 5 is illustrated by way of example in FIG. 1B, wherein the cells 1 to 5 are arranged in a row along the direction 11.

Figure 1B:
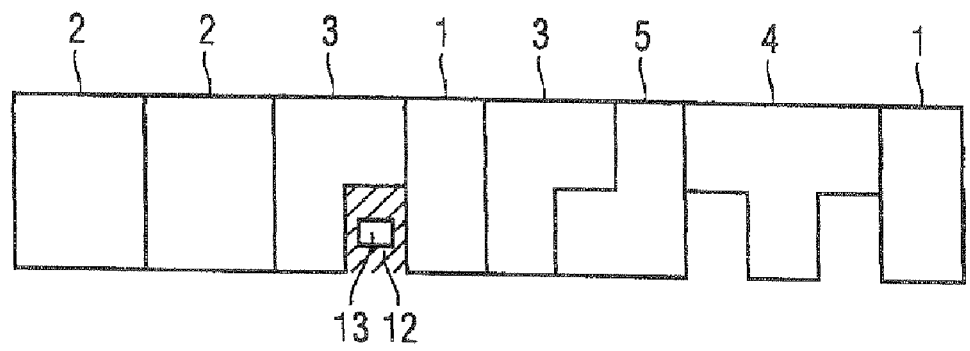
FIG. 1B is a schematic of an illustrative arrangement of the cells shown in FIG. 1A in a row.

On account of the non-rectangular boundary lines of the cells 3 to 5, it may be provided that these cells, as is illustrated in FIG. 1B using the example of the cells 3 and 5, intermesh, that is to say are pushed together and thereby mesh together (e.g., interlock or fit together like puzzle pieces). For example, two or more sides of the polygon of cell 3 may be immediately adjacent to or more sides of the polygon of cell 5. For instance, in FIG. 1B, one of the instances of cell 3 is shown having three polygon sides immediately adjacent to three polygon sides of cell 5. By pushing together adjacent cells having the form 3 to 5, for example, it may be possible to reduce the area used for realizing the integrated circuit.

Furthermore, using the example of the adjacent cells 1 and 3, FIG. 1B shows that a clearance 12 can arise by stringing together two cells, at least one cell of which is not rectangular. The clearance 12 is illustrated in hatched fashion in FIG. 1B. The clearance 12 can be utilized for example for further components 13 or other physical structures. Such components 13 can be e.g. well contacts, diodes for avoiding process antenna effects or capacitive filling structures. Well contacts and diodes for avoiding process antenna effects are structures which are often regularly used in integrated circuits, and which for example may also influence the circuit size. The use of non-rectangular cells may contribute to clearances 12 arising between the cells to an increased extent, thereby potentially increasing the number of positioning possibilities for the components 13, in particular for the diodes discussed. The arrangement illustrated in FIG. 1B has further clearances between the cells 5, 4 and 1 arranged alongside one another.

In accordance with a further exemplary embodiment, a method comprises, besides the steps illustrated in FIGS. 1A and 1B, further steps for designing the layout of an integrated circuit. These steps may include for example the description of a conceptual circuit concept in a suitable hardware description language such as, for example, VHDL (Very High Speed Integrated Circuit Hardware Description Language); the synthesis of a logical circuit design, for example by creating a synthesized netlist containing a description of the modular units necessary for the circuit and their logical interlinking; and the determination of the positioning and of the wiring of the modular units on the semiconductor substrate. In a plurality of intermediate steps, the developed layout can furthermore be tested with regard to the requirements made of the circuit and if appropriate be modified.

The methods can be subdivided into automated methods and methods with manual interventions. In the full custom chip layout, the components may be for example manually positioned and dimensioned, whereas in the semi custom chip layout the components may be automatically positioned and dimensioned.

Components that typically recur repeatedly in an integrated circuit, such as, for example, AND, NAND, OR or NOR gates, inverters or flip-flops, can be realized in the form of predefined optimized cells such as, for example, the cells 1 to 5 illustrated in FIG. 1A. The cells can be present in different configurations and dimensions, e.g. in different power levels, and have to be positioned for creating the layout of the integrated circuit. A standardization of the form of the cells, for example defined by their outer boundary lines, can facilitate the positioning and also the wiring of the cells. Thus, the cells for example on account of their identical maximum extent in direction 10 can be arranged in rows and be connected at their upper and/or lower edge regions to common supply voltage lines running along the rows. Since the extent of the cells is not restricted in the direction 11 perpendicular to the direction 10, the cells can assume different maximum extents in direction 11, such that for example cells which are dimensioned differently and therefore have different extents in direction 11 can be used. Existing cells can be combined in libraries from which appropriate cells are selected manually or automatically for example during the synthesis of the netlist.

FIG. 2 shows, as a further exemplary embodiment, that the cells 1 to 5 known from FIG. 1A can be arranged in a plurality of rows 20, 21, 22, wherein the rows 20 to 22 extend lengthwise along the direction 11. For the voltage and current supply of the circuits represented by the cells, a supply voltage may be provided corresponding to the potential difference between a supply potential VDD and an earth potential VSS. Lines to which the supply potential VDD and the earth potential VSS are respectively applied alternately may be arranged between each of the rows 20 to 22. Consequently, the cells of the two rows adjoining the respective line are supplied with the supply potential VDD and the earth potential VSS by a respective line.

On account of the not necessarily rectangular configuration of the outer boundary line of a cell, the properties of the components or circuits contained in the cell can be taken into account better than in the case of exclusively rectangular cells. By way of example, on account of the number of P- and N-channel transistors contained in a cell, it may be advantageous in some circumstances to use a polygon with five or more corner points rather than a rectangle for the outer form of the cell. For example, the cell form, or shape, can depend on the ratio of the number of P-channel transistors to the number of N-channel transistors and can vary depending on cell function and cell type, for example on account of a cell-function-governed series or parallel connection of transistors or on account of the desired time characteristic during signal transitions. Electrically and/or logically functionally identical cells can occur in a plurality of geometrical configurations; for example, the same functional cell might occur both in an L-shaped configuration and in a T-shaped configuration.

Figure 3A:
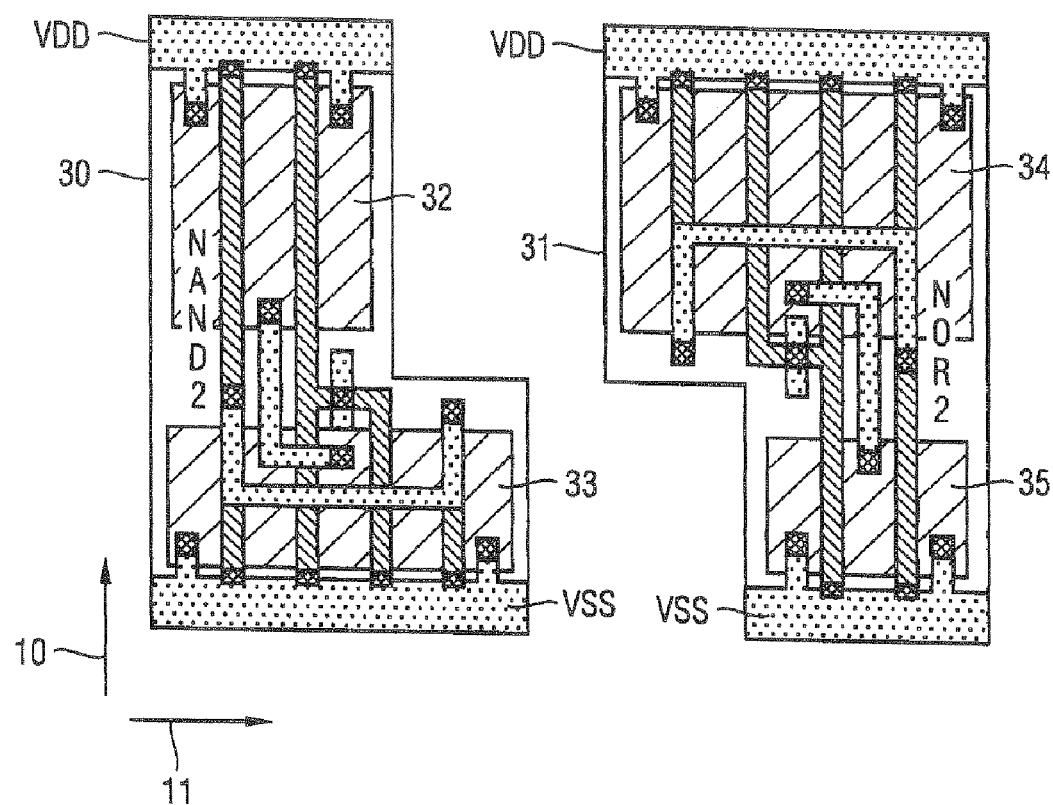
FIG. 3A is a schematic of two illustrative L-shaped cells embodied using CMOS technology.

FIG. 3A illustrates a layout of L-shaped cells 30 and 31 as an exemplary embodiment. In the direction 10, the extent of the cells 30 and 31 is limited by the lines for the supply potential VDD and the earth potential VSS. In direction 11, the cells 30 and 31 each have two different widths. The cells 30 and 31 in this example contain circuits embodied using CMOS (Complementary Metal Oxide Semiconductor) technology, wherein the cell 30 comprises a NAND circuit having two inputs and the cell 31 comprises a NOR circuit comprising two inputs.

Since the conductivity of a P-channel transistor is less by about half than that of an N-channel transistor having the same geometry, the area of P-channel transistors is generally designed to be twice as large as that of N-channel transistors in order to counteract the intrinsically lower conductivity of hole conductors. In the case of the NAND circuit of the cell 30, two N-channel transistors are connected in series and connected to two P-channel transistors connected in parallel, whereas in the case of the NOR circuit of the cell 31, two N-channel transistors are connected in parallel and two P-channel transistors are connected in series. In order that, in the case of the NOR circuit, the current which can flow through the P-channel transistors is essentially the same as the current which can flow through the N-channel transistors, the area of the P-channel transistors is made about four times as large as the area of the N-channel transistors. In the case of the NAND circuit, approximately the same area can be chosen for P- and N-channel transistors. The different area ratios can be seen from FIG. 3A, where the diffusion regions for the P-channel transistors are identified by the reference symbols 32 and 34 and the diffusion regions for the N-channel transistors are identified by the reference symbols 33 and 35.

Figure 3B:
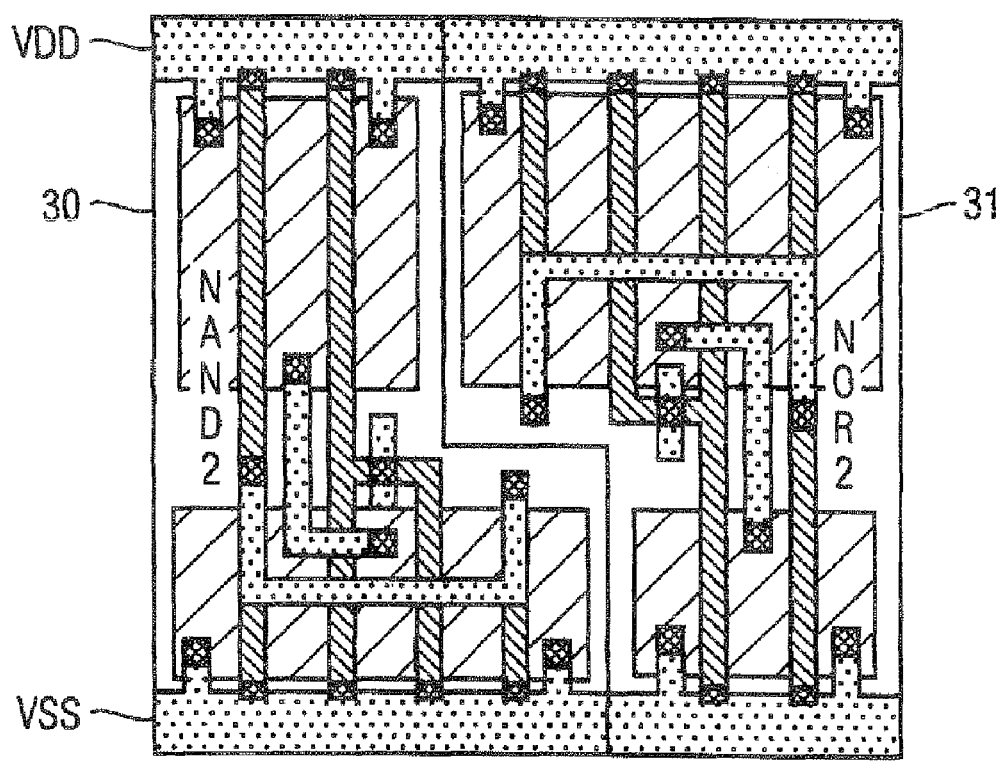
FIG. 3B is a schematic of an illustrative grouping of the cells shown in FIG. 3A.

If rectangular cells were used for the NAND and NOR circuits shown in FIG. 3A, then unused clearances would arise in the cells on account of the size and configuration of the diffusion regions 32 to 35. By contrast, the L-shaped configuration of the cells 30 and 31 in this example makes it possible to interlace the cells 30 and 31, as is shown by way of example in FIG. 3B, and thereby to potentially save chip area. Furthermore, by means of the L-shaped configuration of the cells 30 and 31, it is possible to produce clearances outside the cells 30 or 31, which can be utilized for further components, such as e.g. the component 13 shown in FIG. 1B.

A further potential advantage associated with the freely selectable cell geometry is that parameters of the circuits which the cells comprise can be varied by changing the geometry of the cells. By way of example, the signal transitions from 0 to 1 and from 1 to 0 can be influenced by the size of the diffusion regions. If, in the case of the cell 30, for example, the diffusion region 32 were enlarged in such a way that its extent in the direction 11 corresponded to the extent of the diffusion region 33, then the switching operation from 0 to 1 would thereby be performed more rapidly in comparison with the switching operation from 1 to 0. In a corresponding manner, in the case of enlarging the diffusion region 35 to the extent of the diffusion region 34 in direction 11, the speed of the switching operation of the NOR circuit from 1 to 0 would be increased compared with the switching operation from 0 to 1. Such different signal transitions could be balanced again by circuitry measures.

Furthermore, the non-rectangular configuration of the cells 30 and 31 may be advantageous in this example in the sense that there is a tendency for smaller transistor widths to result for a respective one of the two transistor types whereby leakage currents are reduced.

Figure 4A:
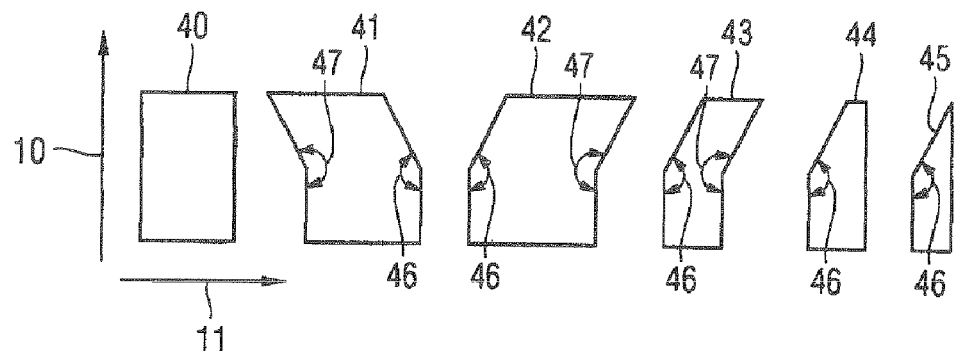
FIG. 4A is a schematic of further illustrative cells having differently shaped outer boundary lines.

FIG. 4A illustrates outer boundary lines of cells 40 to 45 as a further exemplary embodiment. The cells 40 to 45 represent logic modular units from which an integrated circuit can be constructed. The outer boundary lines of the cells 41 to 45 are polygons. The polygons of the cells 41 to 45 each have at least one corner point at which the outer boundary lines form an angle 46 or 47 which is not equal to 90°.

In the present exemplary embodiment, the angle 46 lies within the range of between 90° and 180° non-inclusive, such as within the range of between 120° and 180° non-inclusive, and more particularly, for example, about 135°.

The angle 47 can correspond for example to the difference between the angle 46 and 360°. Moreover, if the angles 46 and 47 are arranged at the same level along the direction 10, the cells "bend" at the same level, as is the case for the cells 41 to 43. In this case, furthermore, the outer boundary lines of the cells 41 to 43 can be subdivided into six sections in each case, wherein two of the six sections in each case run parallel to one another.

The cells 40 to 45 can, as is illustrated in FIG. 4A, all have the same height in the direction 10, but they do not necessarily have to all have the same height in direction 10.

Figure 4B:
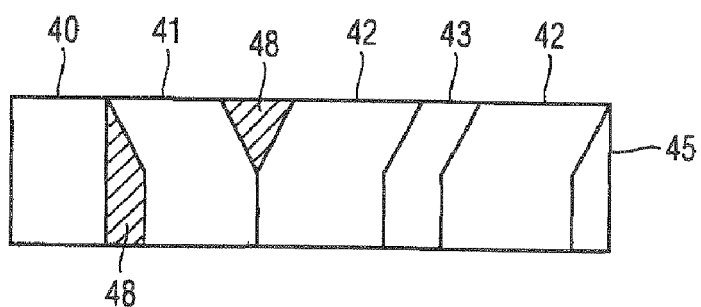
FIG. 4B is a schematic of an illustrative arrangement of the cells shown in FIG. 4A in a row.
Figure 4C:
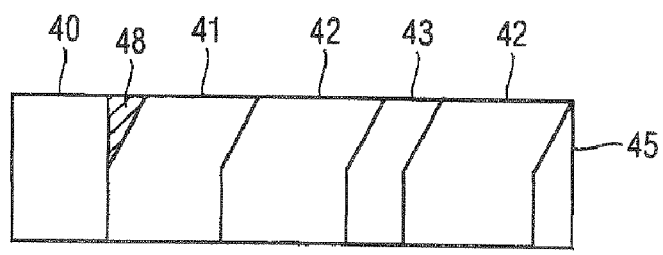
FIG. 4C is a schematic of a further illustrative arrangement of the cells shown in FIG. 4A in a row.

FIGS. 4B and 4C show that the cells 40 to 45 can be arranged in rows. On account of the configuration of the cells 41 to 45, the latter can be arranged in such a way that they intermesh without clearances arising between the cells 41 to 45. However, the cells 40 to 45 can also be strung together in such a way that clearances 48 arise, which can be utilized for the positioning of further components or other physical structures.

It can furthermore be seen from FIGS. 4B and 4C that the cells 44 and 45, the right-hand side of which in each case has no bend, can be used for terminating a row, i.e., can be placed on an end of the row. It is also conceivable to use the cells 44 and 45 as a link between a rectangular part of a cell row and a non-rectangular part of the cell row.

It should furthermore be taken into consideration that one or more of the cells 40 to 45 can also be mirrored, or flipped. By way of example, this is shown in FIG. 4C on the basis of the cell 41 which has been mirrored about the direction 10.

It is also conceivable to combine the cells 1 to 5 shown in FIG. 1 with the cells 40 to 45 in a row.

Figure 5:
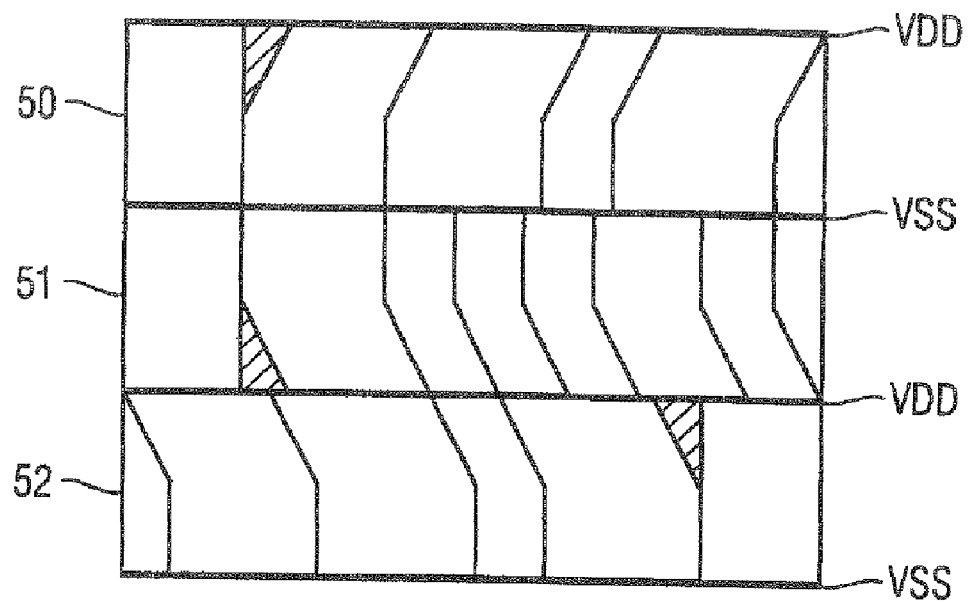
FIG. 5 is a schematic of an illustrative plurality of cell rows.

FIG. 5 shows, as a further exemplary embodiment, that the cells 40 to 45 known from FIG. 4A can be arranged in a plurality of rows 50, 51 and 52, wherein the rows 50 to 52 are oriented along the direction 11. Lines to which the supply potential VDD and the earth potential VSS are respectively applied alternately are arranged between the rows 50 to 52. Consequently, the cells of the two rows adjoining the respective line are supplied with the supply potential VDD and the earth potential VSS by a respective line.

Figure 6:
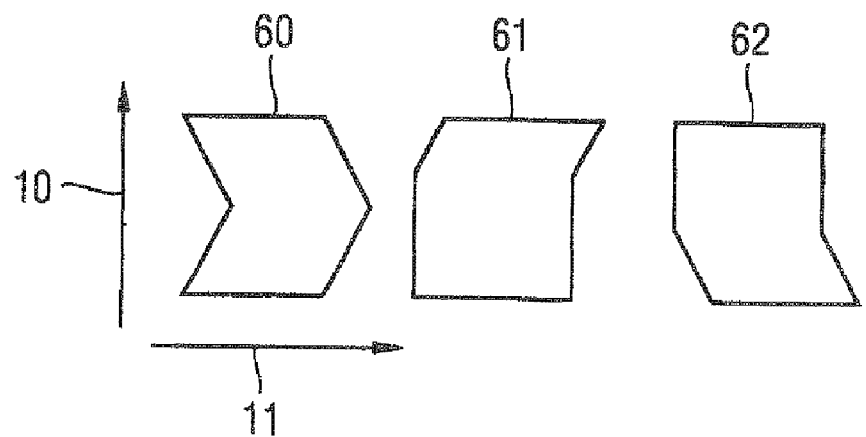
FIG. 6 is a schematic of further illustrative cells having differently shaped outer boundary lines.

FIG. 6 illustrates further cell forms 60 to 62 by way of example. Each of the cells 60 to 62 shows a special feature in comparison with the cells 40 to 45. In the case of the cell 60, no section of its outer boundary line runs parallel to the direction 10. In the case of the cell 61, the "bend" is arranged at a different level along direction 10 from that in the case of the cells 41 to 45. In the case of the cell 62, the upper part is oriented parallel to the direction 10, while the lower part forms an angle with the direction 10.

The above methods described with reference to FIGS. 1 to 6 for creating the layout of an integrated circuit can be integrated for example into computer program products and be stored for example on a computer-readable medium such as one or more memories, hard drives, or magnetic and/or optical discs. For example, a computer may be used for determining the layout and/or storing the layout as data on a computer-readable medium. To do so, the computer may execute computer-executable instructions stored on a computer-readable medium, where the computer-executable instructions are for performing any of the steps described herein. Also, the integrated circuit may be later built in accordance with the determined and stored layout.

The invention claimed is:

1. A method, comprising:
   determining, by a computer, a layout of an integrated circuit comprising a plurality of cells, wherein the cells are arranged in a row, with a first voltage supply line being formed on a first lengthwise side of the row and a second voltage supply line being formed on a second lengthwise side of the row parallel to the first voltage supply line such that a maximum extent of the cells of the row in a first direction perpendicular to the voltage supply lines is defined by a distance between the first and second power supply lines and is identical for each of the cells, and wherein first and second cells of the plurality of cells have different extents in a second direction perpendicular to the first direction; and
   storing data representing the layout on a computer-readable medium.

2. The method of claim 1, wherein determining comprises determining an outer boundary of the first cell to form a polygon having at least one right angle.

3. The method of claim 1, wherein determining comprises determining an outer boundary of the first cell to form a first polygon with at least five corner points, an outer boundary of the second cell to form a second polygon with at least five corner points, such that at least two sides of the first polygon are immediately adjacent to at least two sides of the second polygon.

4. The method of claim 1, wherein the first cell and the second cell are logically functionally identical cells.

5. The method of claim 1, wherein the outer boundary of the first cell is L-shaped or T-shaped.

6. The method of claim 1, further comprising building the integrated circuit according to the stored data.

7. The method of claim 1, wherein the plurality of cells comprises T-shaped cells and L-shaped cells.

8. The method of claim 1, wherein each of the plurality of cells is electrically coupled to the first and the second voltage supply lines.

* * * * *